United States Patent [19]
Alexandersen et al.

[11] Patent Number: 5,105,368
[45] Date of Patent: Apr. 14, 1992

[54] METHOD FOR IMPROVING ROBOT ACCURACY

[75] Inventors: John B. Alexandersen, E. Windsor; John P. Flemming, Princeton; Glenn C. Van Orden, Trenton; Bradford G. Van Treuren, Lambertville, all of N.J.

[73] Assignee: AT&T Bell Laboratories, Murray Hill, N.J.

[21] Appl. No.: 561,440

[22] Filed: Aug. 1, 1990

[51] Int. Cl.⁵ .......................... H05K 3/38; B23P 19/00
[52] U.S. Cl. ....................................... 395/89; 901/47
[58] Field of Search ................... 901/31, 47; 364/513, 364/167.1, 513; 414/796.7

[56] References Cited

U.S. PATENT DOCUMENTS

| | | | |
|---|---|---|---|
| 4,017,721 | 4/1977 | Michaud | 364/513 |
| 4,127,432 | 11/1978 | Kuwano et al. | 156/297 |
| 4,452,557 | 6/1984 | Bouwknegt et al. | 414/796.7 |
| 4,548,667 | 10/1985 | Wical | 156/356 |
| 4,581,566 | 4/1986 | Ekstrom et al. | 364/513 |
| 4,628,441 | 12/1986 | Johnston et al. | 364/167.01 |
| 4,628,464 | 12/1986 | McConnell | 364/513 |
| 4,642,781 | 2/1987 | Szonyi | 364/513 |
| 4,670,849 | 6/1987 | Okada et al. | 364/513 |
| 4,674,048 | 6/1987 | Okumura | 364/424 |
| 4,707,647 | 11/1987 | Coldren et al. | 364/513 |
| 4,712,970 | 11/1987 | Nakamura et al. | 364/513 |
| 4,722,063 | 1/1988 | Yasukawa et al. | 364/513 |
| 4,725,965 | 2/1988 | Keenan | 364/513 |
| 4,831,549 | 5/1989 | Red et al. | 364/513 |
| 4,890,241 | 12/1989 | Hoffman et al. | 364/513 |
| 4,891,767 | 12/1990 | Rzasa et al. | 364/513 |
| 4,980,971 | 1/1991 | Bartachat et al. | 901/47 |

*Primary Examiner*—Allen R. MacDonald
*Assistant Examiner*—George Davis
*Attorney, Agent, or Firm*—Robert B. Levy

[57] ABSTRACT

The positional error of a robotic manipulator (20,22) within its workspace (38) can be reduced by advantageously mapping the manipulator positional error at each of a plurality of grid points (44) within the workspace. Such mapping is carried out by placing a grid (40) containing uniformly spaced grid points (44) in the workspace and then measuring the manipulator error at each grid point. From the map of manipulator positional error values, the manipulator positional error at any point in the workspace can easily be obtained by interpolation.

2 Claims, 3 Drawing Sheets

METHOD FOR IMPROVING ROBOT ACCURACY

TECHNICAL FIELD

This invention relates to a technique for correcting the position error of a robot to enable it to precisely place an article at a predetermined location in a workspace.

BACKGROUND OF THE INVENTION

Robots are used in many industrial applications to place an article at a predetermined location in a workspace as part of a manufacturing process. Within the electronics industry, robots are being employed with increasing frequency to place components on a printed circuit board, repeatedly and with high accuracy. Currently, there is a trend within the electronics industry toward increasing the functionality of electronic components while reducing their overall size. Reduction in the overall component size has led to a reduction in the size and pitch of the component's leads and a concurrent reduction in the size and pitch of the metallized areas on the circuit board to which such leads are bonded. As the pitch and size of the component leads and the metallized circuit board areas have become smaller, the amount of error permitted when placing the components on the boards has likewise decreased. For some very fine pitch components, the maximum allowable placement error is often smaller than the lowest obtainable placement error of the robot which is to carry out such placement.

The accuracy by which a robot can place an electronic component or other type of article at a predetermined location within a workspace (such as on a circuit board) is generally measured by the positional error incurred by when the robot's manipulator is displaced from one location to another location in the workspace. The accuracy of a robot should not be confused with its repeatability, that is, the ability of the robot to return its manipulator to the same position every time. Most robots have very high repeatability, but it is the robot's accuracy which may vary because of many factors, including design, as well as environmental factors, such as thermal expansion.

In many instances, a machine vision system, comprised of a camera, and a processor for processing the camera's image, is employed to improve the placement accuracy of a robot. For example, a machine vision system can be employed to establish the distance (offset) between the robot's manipulator and a fiducial situated at a known location on a circuit board, after the manipulator has been positioned in registration with the fiducial. The measured offset represents the robot's positional error and can be used to compensate the robot to improve its placement accuracy. The disadvantage of this approach is that, in practice, the robot's position error is not a constant and, in fact, varies with the position of the robot's manipulator within the workspace.

The placement accuracy of the robot can also be improved with the aid of a machine vision system when employed to measure the offset between the location where the component is to be placed, and the actual manipulator position once the manipulator is placed in registration with the placement location. The measured offset error can be fed back to the robot to cause it to re-position its manipulator to reduce the offset. Depending on the degree of positional accuracy required, the process of measuring the offset and displacing the robot's manipulator accordingly to reduce the error may be repeated several times until the error is less than a predetermined tolerance factor. Improving the robot's accuracy in this fashion is cumbersome since each time a component is placed, the offset must be precisely measured, and then fed back the robot in order to reposition its manipulator. For each article placed, a small amount of time is spent performing these operations. When placing a large number of components, the overall amount of time spent measuring the robot's positional offset and moving the manipulator accordingly can become significant.

Thus, there is need for a technique for increasing the placement accuracy of a robot which does not incur the aforementioned disadvantages.

SUMMARY OF THE INVENTION

Briefly, in accordance with the invention, a technique is disclosed for improving the accuracy of placement of an article within the workspace of a robot by the robot's manipulator. The technique is carried out by first establishing the positional error of the robot's manipulator at each of a set of coordinates in the robot's workspace. This step is generally referred to as "mapping the robot's workspace" and is carried out by displacing the manipulator, which has an image acquisition device (e.g., a television camera) attached thereto, such that the camera is placed in registration with a successive one of a set of grid points on a grid. The camera is initially placed in registration with a first (e.g., origin) grid point at which the error is defined to be zero and then the manipulator is displaced so that the camera is placed in successive registration with a subsequent one of the other grid points, each being a precise known distance from the origin point. The difference between the distance moved by the manipulator from the origin point to the location at which the camera registers with a particular grid point, and the known distance of that grid point from the origin point constitutes the robot's error for the particular grid point. By moving the manipulator so that the camera registers with each of the grid points on the grid, the manipulator error at each of a set of corresponding manipulator coordinates in the workspace can be found. Once the manipulator error has been mapped, that is to say, the error has been established at each manipulator coordinate corresponding to a particular grid point, the manipulator error at any point in between can easily by interpolation. The computed robot error is then used to compensate the robot to enable the robot to precisely place the article at the placement location.

DETAILED DESCRIPTION

Figure 1:
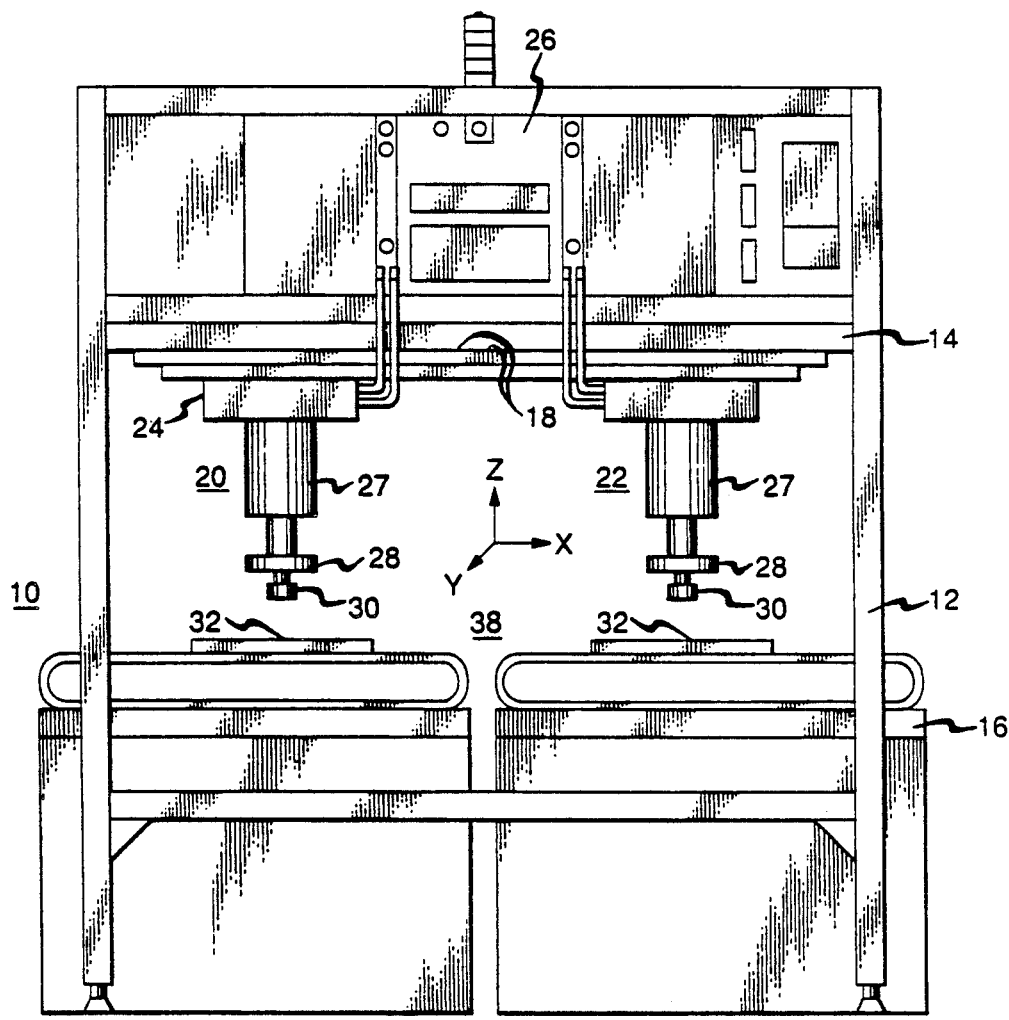
FIG. 1 is a front view of a gantry-type linear-motor-operated robot on which the accuracy improvement technique of the invention is implemented.

The accuracy improvement technique of the invention may best be understood by reference to FIG. 1 which is a front view of a gantry-type, linear-motor-propelled robot 10. In a preferred embodiment, the robot 10 comprises an AT&T Model 200 Flexible Workstation, available from AT&T, Berkeley Heights N.J. While the technique of the invention will be described in connection with this particular robot 10, the technique is equally applicable to other types of robots as will be appreciated hereinafter.

The robot 10 is comprised of a four-legged frame 12 which mounts a slab-like metal platen 14 that overlies a conveyor 16 which runs through the openings in the legs of the frame. (The conveyor 16 itself is typically not part of the robot 10.) The platen 14 comprises a sheet of ferromagnetic material (iron or steel) whose undersurface has a plurality of uniformly spaced grooves 18 etched parallel to its lateral x and y axes. Each of a pair of manipulators 20 and 22 is magnetically attached to, so as to depend from, the undersurface of the platen 14. The manipulators 20 and 22 each contain a "Sawyer"-type linear motor 24, as described in U.S. Pat. Nos. RE 27,289 and RE 27,436, issued on Feb. 2, 1972 and July 18, 1972, respectively, to Bruce Sawyer and incorporated by reference herein.

The linear motor 24 within each manipulator 20,22 operates to propel the manipulator across the platen 14 in response to electrical signals supplied from a control system 26 of the type described in U.S. Pat. No. 3,836,835, issued on Sept. 9, 1974, to Bruce Sawyer and incorporated by reference herein. As each manipulator 20,22 is propelled by its linear motor 24 across the platen 14, air is forced between the motor and the platen, thus creating an "air bearing" which virtually eliminates any friction therebetween.

Each manipulator 20,22 also includes an actuator 27 which serves to displace a gripping member 28 vertically along a z axis. The actuator 27 enables the gripping member 28 to pick up and deposit an object 30 (i.e., an electronic component) within a workspace 38 which occupies the volume which underlies the platen 14 and which is bounded by the upper and lower z axis travel of the gripping member. Lying within the workspace 38 on the upper surface of the conveyor 16 is a circuit board 32 on which components 30 are placed by one or both of the manipulators 20,22 at a predetermined location.

Figure 2:
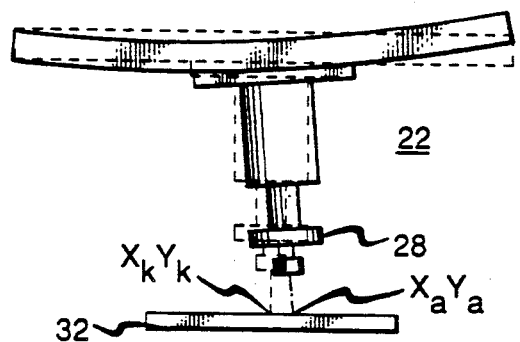
FIG. 2 is an enlarged view of a portion of the robot of FIG. 1 illustrating how the placement accuracy of the robot may be affected by mechanical factors.

Referring to FIG. 2, there is shown an enlarged view of a portion of the platen 14 showing only the manipulator 22. While the platen 14 is illustrated in FIG. 1 as being flat, in actuality, the platen may exhibit some warpage as shown in FIG. 2, with the amount of warpage being exaggerated for purposes of illustration. Because of the warpage, the centroid of the gripping member 38 is actually situated at a set of coordinates $x_a,y_a$ on the circuit board 32 different from the coordinates $x_k,y_k$ at which the control system 26 of FIG. 1 knows the gripper member centroid to be located. The difference between $x_a,y_a$ and $x_k,y_k$ constitutes the positional error of the robot 10, which, depending on its magnitude, can adversely affect component placement.

Figure 3:
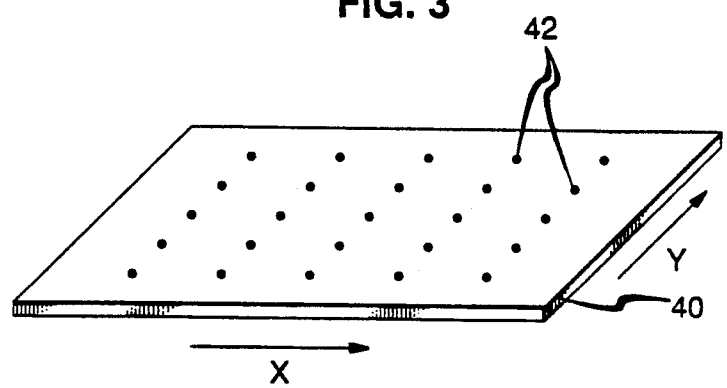
FIG. 3 is perspective view of an alignment grid which is utilized to map the positional error of the robot of FIG. 1.

In accordance with the invention, the robot 10 of FIG. 1 is compensated for positional errors by first establishing (i.e., "mapping") the positional error of each manipulator 20,22 within the workspace 38 at each of a plurality of fixed points. Such mapping is facilitated with the aid of an alignment grid 40 which, as seen in FIG. 3, comprises a plate, typically made of glass or the like, having a matrix of grid points 42 formed thereon such that the grid points are precisely spaced from each other a known distance. In practice, the grid points 42 are uniformly spaced apart, although as will be appreciated hereinafter, the dots need not be uniformly spaced. In a preferred embodiment, the grid comprises a commercially available grid obtained from Max Levy Autograph Inc., Philadelphia Pa., whose grid points 42 have a center-to-center of $1.0\pm0.0005$ inch.

Figure 4:
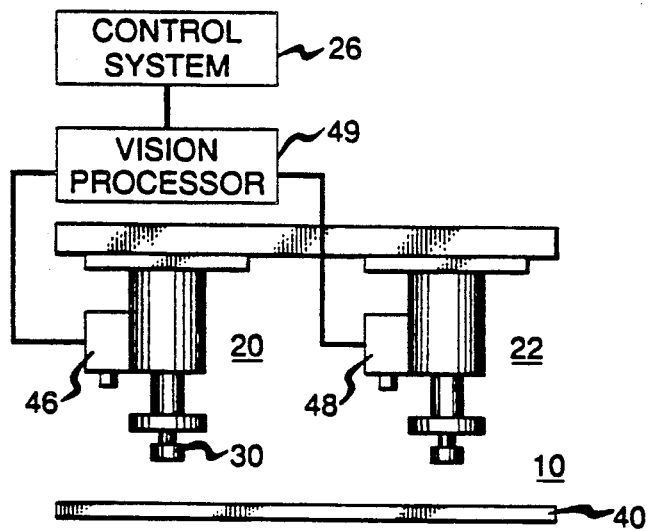
FIG. 4 is a block schematic diagram of a machine vision system employed to map the positional error of the robot of FIG. 1.

The positional error of each of the manipulators 20 and 22 of FIG. 1 is established in accordance with the actual distance between a pair of the grid points 42 and the distance moved by the manipulator between such points. To determine the manipulator positional error in this manner, the robot 10 is equipped with a machine vision system, which, as seen in FIG. 4, is comprised of a pair of television cameras 46 and 48, each mounted to a separate one of the manipulators 20,22, respectively, so as to look down at the grid 40. Each of the cameras 46 and 48 has its output coupled to a vision processor 49 which serves to analyze the image of each camera to find the centroid of each grid point 42. In a preferred embodiment, the vision processor 49 comprises an IRI model SVP512 vision processor available from IRI Corp., Carlsbad, Calif., which contains a program which allows this processor to automatically establish the centroid of features within the image input thereto. The output of the vision processor 49 is coupled to the control system 26 of FIG. 1.

Referring to FIG. 4, there is shown a flowchart representation of the steps carried out to map the positional error of each of the manipulators 20,22 of FIG. 1. For ease of discussion, the positional error of the manipulator 20 is measured first. The first step (step 50) in the method depicted in FIG. 4 of measuring the positional error of the manipulator 20 is to place the grid 40 of FIG. 3 such that the dots 42 are in registration with a separate one of the cameras 46 and 48 on the manipulators 20 and 22, respectively. With the gantry type robot 10 of FIG. 1, the grid plate 40 is typically placed below the manipulators 20 and 22 so as to be in their workspace, as seen in FIG. 4, with the plate parallel to the X-Y plane to be mapped, i.e., the plane of the platen 14. It is, however, not necessary to place the grid plate 40 in the workspace of the manipulators 20 and 22. All that is necessary is for the grid plate 40 to be placed with its major surface everywhere equidistant from each of the cameras 46 and 48 such that each grid point 42 may be registered therewith. Typically, for the robot 10, the easiest way to place the grid plate 40 to satisfy these constraints is to place the plate below the manipulators 20,22 parallel to the platen 14 as seen in FIG. 4.

Figure 5:
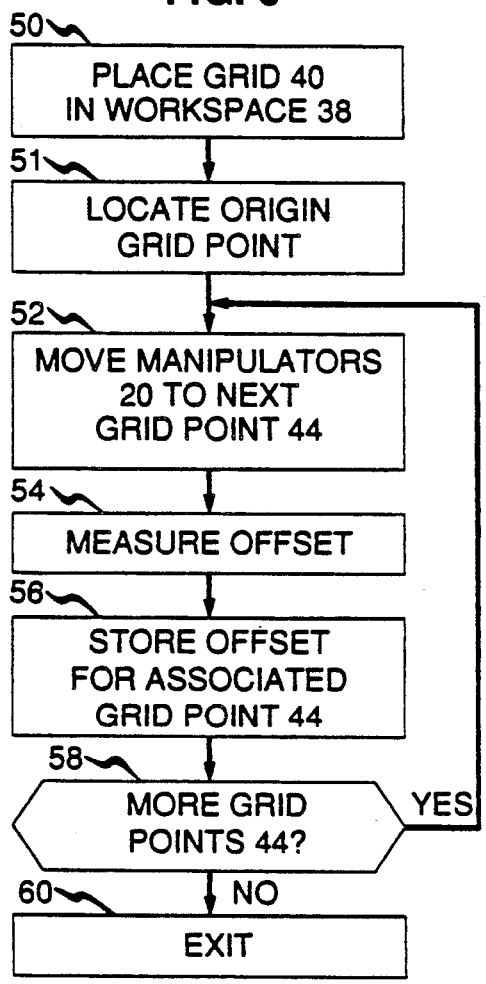
FIG. 5 is flowchart diagram illustrating the steps performed to map the positional error of the robot of FIG. 1.

The next step (step 51) in the error mapping routines of FIG. 5 is to designate a particular one of the grid points 42 as an "origin point" and to displace the manipulator 20 to locate the grid point within the camera's field of view. Typically, the manipulator 20 is displaced to locate the center of the field of view (CFV) of the camera 46 in registration with the centroid of each grid point 42 to avoid distortions attributable to the camera 46 optics from interfering with the offset measurement.

The actual manner in which the CFV of the camera 46 is located in registration with the centroid of each grid point 42 will be discussed with respect to FIG. 6.

Mapping of the manipulator 20 error mapping is accomplished by displacing each manipulator 20,22 so that its camera 46, 48, respectively, is placed in registration with successive grid points 42. The difference between the distance moved by each of the manipulators 20 and 22, between where its camera 46, 48 is in registration with a successive pair of grid points 42 and the actual center-to-center distance between those points defines the manipulator error. In order to accurately compute the manipulator error, it is useful to measure all distances with respect to a single origin grid point 42 at which the error is deemed to be zero. Typically, one of the corner grid points 42 is designated as the origin point although another grid point could be so designated.

Following the designation of the origin point 42 during step 51, step 52 is executed, and the manipulator 20 is displaced so that its camera 46 has its CFV registered with the centroid of a successive one of the grid points. The distance moved by the manipulator 20 from the origin point 42 is registered with the camera 46 to where the camera is registered with the next successive grid point is then compared to the actual center-to-center distance between these grid points during step 54. The difference between measured distance and the known distance between the origin grid point and the grid point now registered with the camera 46 on the manipulator 20 of FIG. 4 constitutes the manipulator offset or error associated with the registered grid point. Once the offset of the manipulator 20 associated with the particular grid point 42 has been measured, then the measured offset associated with this grid point is stored (step 56) within the control system 26 of FIG. 1. Following step 56, a check is made whether there are any further grid points 42 on the grid 40 which have yet been registered with the camera 46. If so, then step 52, and those following it are re-executed to establish the error of the manipulator associated with each such grid point 42. Otherwise, once each of the grid points 42 has been registered with the camera 46, and the manipulator 20 error associated with each grid point has been measured, then the routine of FIG. 5 is exited (step 60).

To obtain an accurate measurement of the offset of the manipulator 20 associated with each grid point 42, it is necessary to accurately record the travel of the manipulator 20 from where its camera 46 registers with the origin grid point 42 to where the camera registers with each successive grid point on the plate 40. To avoid errors attributable to distortion of the optics of the camera 46, it is desirable to have the CFV of the camera registered with the centroid of each grid point 42 during the offset measurement process. Referring now to FIG. 6, there is shown, in flow chart form, the steps executed to measure the manipulator 20 offset such that the CFV of the camera 46 is aligned with the centroid of each successive grid point 42. The first step (step 62) is to measure the offset of the manipulator 20 in the manner discussed. A check is then made if in fact the centroid of the successive grid point 42 is at CFV of the camera 46 (step 64) when the measurement was made. The particular embodiment of the vision system 49 chosen for use has the capability to determine the centroid of an object within the field of view of the camera 46, and the degree to which the object's centroid is offset from the CFV of the camera. If the grid point 42 is situated at the CFV of the camera 46 within a tolerance factor, (typically-±one-half the precision of the manipulator 20), then program execution ends (step 66) as the grid point is deemed to be at the CFV of the camera. Otherwise, step 68 is executed, and the control system 26 of FIG. 1 displaces the manipulator 20 to reduce the offset in accordance with data from the vision system 49 indicative of the offset of the grid point centroid from the CFV of the camera 46. Thereafter, program execution branches back to step 62.

It is important to recognize that the offset of the manipulator 20 is not dependent on the offset between the camera 46 and the manipulator itself. The offset between the camera 46 and the manipulator 20 remains constant. Since it is the relative movement of the manipulator 20 required to locate the camera 46 in successive registration with the origin grid point 42, and another of the grid points on the plate 40 which is of concern, the camera offset has no effect on the offset measurement. The camera 46 on the manipulator 20 (as well as the camera 48 on the manipulator 22) is used merely to gauge the relative offset between the manipulator 20 and the grid point 42 to establish the relative manipulator travel from this point to the origin point.

As should now be appreciated, locating the grid plate 40 within the workspace of the manipulators 20 and 22 is not critical to the process of measuring the manipulator offset. As long as the grid plate 40 can be located so that the relative motion of the manipulator 20 between the coordinates in its workspace where the camera is in registration with the origin grid point 42 and a succeeding one of the grid points can be accurately measured, the manipulator offset can thus be obtained. Depending on the type of robot, it may in fact be desirable to locate the grid plate outside of the robot's workspace.

Establishing the error of the manipulator 20 associated with each of the grid points 44 in the manner described earlier with respect to FIGS. 5 and 6 serves to map the manipulator error in the workspace 38. By knowing the error of the manipulator 20 associated with each of the grid points 42, the manipulator error at a placement location lying in between a quadrant of grid points can be established by interpolation. Having established the manipulator 20 error at the placement position, the error is fed back to the control system 26 to compensate the manipulator for such error. In this way the placement error of the manipulator 20 can be reduced.

Figure 6:
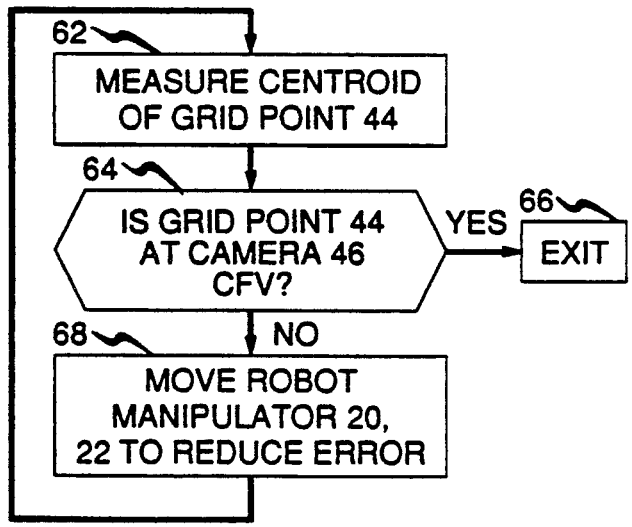
FIG. 6 is a flowchart diagram of a subroutine within the flowchart of FIG. 3.

Once the error of the manipulator 20 of FIG. 1 has been mapped as described in FIGS. 5 and 6, the manipulator 22 error is mapped in exactly the same fashion. The error of the manipulator 22 at a predetermined placement position can be determined by interpolation in the same manner that the manipulator 20 error is established. Once the manipulator 22 error is established, the error is fed back to the control system 26 of FIG. 1 to compensate the manipulator for such error. Note that the error of the manipulator 22 could in fact be mapped simultaneously with the manipulator 20 as long as care was taken to avoid having the manipulators collide.

The degree of error compensation achievable for each of the manipulators 20 and 22 depends on the precision to which manipulator error is mapped in the workspace 38 in accordance with the invention. As indicated, special care is taken to assure that the error of the manipulators 20, 22 associated with each grid point 42 is measured as accurately as possible. To further increase the accuracy of the error map obtained as described, the spacing between the grid points 42 can be made smaller, thus increasing the number of points to be registered. However, increasing the number of grid points 42 increases the time required to accomplish error mapping.

As thus described, the error of each of the manipulators 20 and 22 is mapped within its workspace using a single grid plate 40 having a matrix of uniformly spaced grid points 42. In some instances, it may be desirable to map the error of one or both of the manipulators 20 and 22 more precisely within a certain portion of its workspace than in other areas. To achieve such a result, the arrangement of the grid points 42 would be altered such that within one or more predefined regions, the spacing of the grid points was reduced to achieve the desired increase in accuracy.

Further, the instant technique has been described with respect to mapping the X-Y error of the manipulators in a single plane parallel to the platen 14. The X-Y error is each of several different planes parallel to the platen can easily be obtained simply by placing the plate 40 at varying heights from the platen. Thus, a three dimensional error map for each of the manipulators 20 and 22 could be obtained.

The foregoing describes a technique for improving the placement accuracy of a robot 10 by mapping the error of its manipulators 20, 22 within its workspace 38 at a plurality of coordinates and compensating for the manipulator placement error in accordance with the mapped error.

It is to be understood that the above-described embodiments are merely illustrative of the principles of the invention. Various modifications and changes may be made thereto by those skilled in the art which will embody the principles of the invention and fall within the spirit and scope thereof.

We claim:

1. A method for compensating a robotic manipulator for positional error when the robotic manipulator is to be displaced, in succession, to each of a plurality of work locations where the manipulator is to perform work, comprising the steps of:
   (a) establishing a positional error for the robotic manipulator at each of a plurality of spaced grid points whose locations are known to the manipulator by
      (1) displacing the robotic manipulator to locate an image acquisition device on the manipulator in aligned registration with a successive one of the grid points;
      (2) checking if the image acquisition device has the center of its field of view in aligned registration with the centroid of the grid point within a predetermined tolerance factor; and, if not, then successively displacing the manipulator to locate the center of the field of view of the image acquisition device closer to the centroid of the grid point and re-checking if the image acquisition device is in such aligned registration with the grid point;
      (3) establishing the positional error for the robotic manipulator at the grid point in accordance with the difference between the known grid point location and the manipulator position once the image acquisition device has the center of its field of view in aligned registration with the successive grid point;
   (b) displacing the manipulator to each successive work location to perform work;
   (c) determining, at each such successive work location, the actual manipulator error in accordance with the manipulator error at each of a predetermined number of grid point locations closest to such successive work location; and
   (d) compensating the robotic manipulator by an amount equal to the actual degree of manipulator error.

2. A method for establishing an error map for a robotic manipulator which indicates the manipulator error at each of a plurality of spaced grid points within a workspace, comprising the steps of:
   (a) placing an alignment grid, having a plurality of uniformly spaced grid points therein, within a workspace associated with a robotic manipulator;
   (b) displacing the robotic manipulator into registration with a successive one of the grid points on the grid;
   (c) measuring how far the manipulator is from the grid point by the steps of:
      (i) measuring how far the centroid of the grid point is from the center of the field of view of an image-acquisition device attached to the manipulator;
      (ii) moving the manipulator closer to the grid point centroid if the distance between the grid point centroid and the centroid of the image-acquisition device field of view is greater than a predetermined tolerance factor;
      (iii) repeating the steps of (i) and (ii) until the grid point centroid is in substantial registration with the centroid of the image-acquisition device field of view, at which time the location of the grid point centroid can be established from the manipulator position and the position of the image-acquisition device from the manipulator;
   (d) storing the distance from the manipulator to the associated grid point; and
   (e) repeating the steps of (b)–(d) until the manipulator error associated with each of the grid points is measured.

* * * * *